(12) United States Patent
Park

(10) Patent No.: US 7,593,283 B2
(45) Date of Patent: Sep. 22, 2009

(54) SEMICONDUCTOR MEMORY DEVICE

(75) Inventor: Nak-Kyu Park, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 109 days.

(21) Appl. No.: 11/822,002

(22) Filed: Jun. 29, 2007

(65) Prior Publication Data

US 2008/0084776 A1   Apr. 10, 2008

(30) Foreign Application Priority Data

Sep. 28, 2006   (KR) .................. 10-2006-0095181

(51) Int. Cl.
*G11C 8/00* (2006.01)
(52) U.S. Cl. ............. 365/230.03; 365/193; 365/189.04; 365/189.14; 365/189.15; 365/189.16
(58) Field of Classification Search ............ 365/230.03, 365/193, 189.04, 189.14, 189.15, 189.16
See application file for complete search history.

(56) References Cited

U.S. PATENT DOCUMENTS

| | | | |
|---|---|---|---|
| 5,771,199 A | 6/1998 | Lee | |
| 6,310,816 B2 | 10/2001 | Manning | |
| 6,414,868 B1 | 7/2002 | Wong et al. | |
| 7,200,065 B2 * | 4/2007 | Lee | 365/226 |
| 2004/0032776 A1 | 2/2004 | Kim et al. | |
| 2006/0002222 A1 * | 1/2006 | Lee | 365/226 |
| 2006/0018168 A1 | 1/2006 | Kim | |

FOREIGN PATENT DOCUMENTS

| | | |
|---|---|---|
| JP | 2003-143240 | 5/2003 |
| JP | 2005-056529 | 3/2005 |
| JP | 2005-317124 | 11/2005 |
| KR | 10-2005-0022855 | 3/2005 |

OTHER PUBLICATIONS

Korean Office Action, with English translation, Korean Patent Application No. KR 2006-0095181, mailed Sep. 22, 2007.

* cited by examiner

*Primary Examiner*—Thong Q Le
(74) *Attorney, Agent, or Firm*—Mannava & Kang, P.C.

(57) ABSTRACT

A semiconductor memory device includes: a global input/output line; a first global core line; a second global core line; a global core line controller disposed between the first global core line and the second global core line; a first bank coupled to the global core line controller through the first global core line; and a second bank coupled to the global core line controller through the second global core line.

17 Claims, 9 Drawing Sheets

SEMICONDUCTOR MEMORY DEVICE

CROSS-REFERENCE TO RELATED APPLICATIONS

The present invention claims priority of Korean patent application number 10-2006-0095181, filed on Sep. 28, 2006, which is incorporated by reference in its entirety.

BACKGROUND OF THE INVENTION

The present invention relates to a semiconductor device, and more particularly, to a semiconductor memory device having a multi-bank structure.

In a dynamic random access memory (DRAM), a memory density is increasing from 256M to 512M and from 512M to 1 G so as to improve cost performance. Further, a bank structure supported by the DRAM is changing from a 4-bank structure to an 8-bank structure and from an 8-bank structure to a 16-bank structure.

There are limitations in increasing the memory density and the multi-bank. In this regard, write global input/output (I/O) lines (WGIO_IO), write global core lines (WGIO_CORE), read global core lines (RGIO_CORE), and read global I/O lines (RGIO_IO) will be described below. External data are transferred to cells of a designated bank through the write global I/O lines (WGIO_IO) and the write global core lines (WGIO_CORE). Data stored in cells of a designated bank are transferred to external circuits through the read global core lines (RGIO_CORE) and the read global I/O lines (RGIO_IO).

FIG. 1 is a layout diagram of a conventional 512 MB DRAM having eight banks BANK0, BANK1, BANK2, BANK3, BANK4, BANK5, BANK6 and BANK7. The DRAM of FIG. 1 operates in an x32 operation mode to read/write 32 bits of data in each column operation. The DRAM includes thirty-two DQ pads for the x32 operation mode. In addition, the DRAM has a 4-bit prefetch architecture.

Meanwhile, the DRAM is designed to have I/O paths with a multi-bit structure according to data option modes, e.g., x4, x8, x16, x32, etc. Hence, the semiconductor memory devices may be differently configured even though they have the same capacity. In other words, after the semiconductor device is designed and fabricated such that it satisfies all of the x4, x8, x16, and x32 operation modes, the semiconductor memory device is configured such that it operates in the x4, x8, x16, or x32 operation mode according to a selected option.

Referring to FIG. 1, the 512 MB DRAM is divided into four quarters QA, QB, QC and QD. The four 128 MB quarters QA, QB, QC and QD read or write data through corresponding ones of pads DQ<0:31>. That is, the quarter QA reads or writes data through the pads DQ<0:7>, the quarter QB reads or writes data through the pads DQ<8:15>, the quarter QC reads or writes data through the pads DQ<16:23>, and the quarter QD reads or writes data through the pads DQ<24:31>.

In the case of the write operation in the x32 operation mode, data inputted through all of the pads DQ<0:31> are inputted to the corresponding bank of the quarters QA, QB, QC and QD, that is, one of the banks BANK0, BANK1, BANK2, BANK3, BANK4, BANK5, BANK6 and BANK7. In the case of the read operation in the x32 operation mode, 32-bit data are outputted from the corresponding bank of the quarters QA, QB, QC and QD, that is, one of the banks BANK0, BANK1, BANK2, BANK3, BANK4, BANK5, BANK6 and BANK7, through the corresponding pads DQ<0:31>.

Meanwhile, a strobe decoder 10 is disposed in the center of the chip and outputs bank strobe signals MSTROBE_BANK<0:7> to center portions 20A, 20B, 20C and 20D of the respective quarters QA, QB, QC and QD so as to enable the corresponding banks BANK0, BANK1, BANK2, BANK3, BANK4, BANK5, BANK6 and BANK7. Although each of the center portions 20A, 20B, 20C and 20D of the respective quarters QA, QB, QC and QD is indicated by one block in FIG. 1, each of them includes a read/write strobe signal generator receiving the bank strobe signals MSTROBE_BANK<0:7>, an input data buffer, and an output data buffer, which will be described later with reference to FIGS. 3, 4 and 5, respectively.

FIG. 2 is a block diagram of the strobe decoder 10 illustrated in FIG. 1.

Referring to FIG. 2, the strobe decoder 10 receives a column strobe signal STROBE_PRE and bank information CAST<0:2> on eight banks BANK0, BANK1, BANK2, BANK3, BANK4, BANK5, BANK6 and BANK7 to output bank strobe signals MSTROBE_BANK<0:7>. The column strobe signal STROBE_PRE is a signal that is activated during a column operation in the read/write operations.

FIG. 3 is a circuit diagram of the read/write strobe signal generator illustrated in FIG. 1.

Referring to FIG. 3, the read/write strobe signal generator 23A receives a read/write signal WTRZT and the bank strobe signals MSTROBE_BANK<0:7>, e.g., MSTROBE_BANK<0> for enabling the bank BANK0, and outputs a read strobe signal RSTROBE_BANK<0> and a write strobe signal WSTROBE_BANK<0> corresponding to the bank BANK0.

The read/write signal WTRZT becomes a logic high level in the write operation and a logic low level in the read operation. When the read or write operation is determined, the read strobe signals RSTROBE_BANK<0:7> or the write strobe signals WSTROBE_BANK<0:7> corresponding to the respective banks are generated according to the bank strobe signals MSTOBE_BANK<0:7>. Then, the selected banks are enabled and the read/write operations are performed thereto.

The strobe signal generator 23A includes first and second delay units D1 and D2 in order for a more stable timing matching of the read strobe signals RSTROBE_BANK<0:7>and the write strobe signals WSTROBE_BANK<0:7>in the read/write operations.

The structure and operation of the conventional DRAM will be described in more detail with reference to FIG. 1.

For convenience, the DRAM will be described centering on the quarter QA. The write global I/O lines WGIO_IO_EV0<0:7>, WGIO_IO_OD0<0:7>, WGIO_IO_EV1<0:7> and WGIO_IO_OD1<0:7>, and the read global I/O lines RGIO_IO_EV0<0:7>, RGIO_IO_OD0<0:7>, RGIO_IO_EV1<0:7> and RGIO_IO_OD1<0:7> are connected to the pads DQ<0:7> corresponding to the quarter QA. The write global core lines WGIO_CORE_EV0<0:7>, WGIO_CORE_OD0<0:7>, WGIO_CORE_EV1<0:7> and WGIO_CORE_OD1<0:7>, and the read global core lines RGIO_CORE_EV0<0:7>, RGIO_CORE_OD0<0:7>, RGIO_CORE_EV1<0:7> and RGIO_CORE_OD1<0:7> are connected to the respective banks. Those lines are provided for the 4-bit prefetch operation. In the following description, the prefetch operation will be omitted. That is, the following description will be focused on the "WGIO_IO_EV0<0:7>" line of the write global I/O lines WGIO_IO_EV<0:7>, WGIO_IO_ODD0<0:7>, WGIO_IO_EV1<0:7> and WGIO_IO_OD1<0:7>, and the "WGIO_CORE_EV0<0:7> line of the write global core lines WGIO_CORE_EV0<0:7>, WGIO_CORE_OD0<0:7>, WGIO_CORE_EV1<0:7> and WGIO_CORE_OD1<0:7> for transferring data in the write operation. In addition, the following description will be focused on the "RGIO_CORE_EV0<0:7> line of the read global core lines RGIO_CORE_EV0<0:7>, RGIO_CORE_OD0<0:7>, RGIO_CORE_EV1<0:7> and RGIO_CORE_OD1<0:7>, and the "RGIO_IO_EV0<0:7> line of the read global I/O lines RGIO_IO_EV0<0:7>, RGIO_IO_OD0<0:7>, RGIO_IO_EV1<0:7> and RGIO_IO_OD1<0:7> for transferring data in the read operation.

In the write operation, external 8-bit data for the bank of the quarter QA are inputted through the pads DQ<0:7> to the write global I/O lines WGIO_IO_EV0<0:7>. The input data are inputted to an input data buffer and then transferred through the write global core lines WGIO_CORE_EV0<0:7> to the corresponding enabled bank.

FIG. 4 is a circuit diagram of the input data buffer 21A illustrated in FIG. 1. For convenience, the input data buffer 21A will be described centering on the "WGIO_IO_EV0<0> line of the write global I/O lines WGIO_IO_EV0<0:7> and the "WGIO_CORE_EV0<0> line of the write global core lines WGIO_CORE_EV0<0:7>.

Referring to FIG. 4, the input data buffer 21A includes inverters INV1 and INV2 for buffering data inputted through the write global I/O line WGIO_IO_EV0<0>, and inverters INV3 and INV4 for repeating the buffered data. The input data buffer 21A outputs the data to the write global core line WGIO_CORE_EV0<0>.

Next, the read operation will be described below with reference to FIG. 1.

8-bit data of the bank BANK0 are inputted to the read data buffer through the read global core lines RGIO_CORE_EV0<0:7>, and an output signal of the read data buffer is transferred through the read global I/O line RGIO_IO_EV0<0:7> to the corresponding pads DQ<0:7>.

FIG. 5 is a circuit diagram of the output data buffer 22A illustrated in FIG. 1. For convenience, the output data buffer will be described centering on the "RGIO_IO_EV0<0> line of the read global I/O lines RGIO_IO_EV0<0:7> and the "RGIO_CORE_EV0<0> line of the read global core lines RGIO_CORE_EV0<0:7>.

Referring to FIG. 5, the output data buffer 22A includes inverters INV5 and INV6 for repeating data inputted through the read global core lines RGIO_CORE_EV0<0>, and inverters INV7 and INV8 for buffering the inputted data. The output data buffer 22A outputs the buffered data to the read global I/O lines RGIO_IO_EV0<0>.

As the memory density is changing from 512 MB to 1 GB and the multi-bank structure is changing from an 8-bank structure to a 16-bank structure, the loading and junction of the respective global lines in the conventional structure increase more than two times. Therefore, data transferred through the respective global lines experience a timing delay and a voltage level is sloped. Consequently, the semiconductor device cannot operate normally.

Further, the number of the bank strobe signals MSTROBE_BANK<0:7> outputted from the strobe decoder 10 that is disposed in the middle of the chip, that is, the peripheral region, increases with increase of number of the banks. The number of the global lines transferring the signals also increases and the shielding lines increases. Consequently, the layout area increases.

SUMMARY OF THE INVENTION

Embodiments of the present invention are directed to providing a semiconductor memory device that can reduce the loading of global lines by dividing bank regions in the read and write operations and generates bank strobe signals not in a peripheral region but a bank region.

In accordance with an aspect of the present invention, there is provided a semiconductor memory device, including a global input/output line; a first global core line; a second global core line; a global core line controller disposed between the first global core line and the second global core line; a first bank coupled to the global core line controller through the first global core line; and a second bank coupled to the global core line controller through the second global core line.

DESCRIPTION OF SPECIFIC EMBODIMENTS

Hereinafter, a semiconductor memory device having a multi-bank structure in accordance with exemplary embodiments of the present invention will be described in detail with reference to the accompanying drawings.

Figure 6:
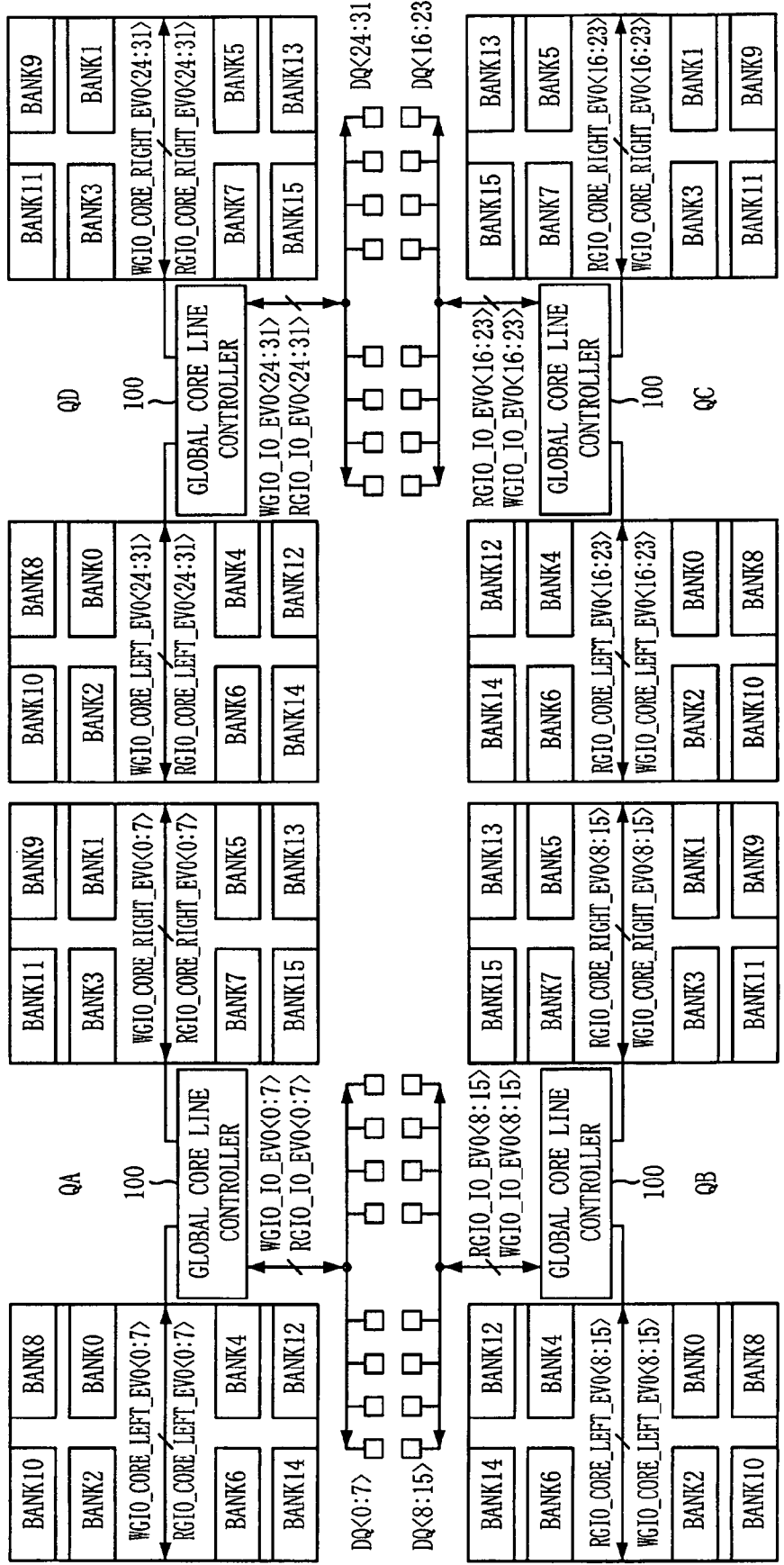
FIG. 6 is a layout diagram of a DRAM in accordance with an embodiment of the present invention.

FIG. 6 is a layout diagram of a DRAM in accordance with an embodiment of the present invention. The DRAM of FIG. 6 has a memory capacity of 1 GB and includes sixteen banks BANK0, BANK1, BANK2, BANK3, BANK4, BANK5, BANK6, BANK7, BANK8, BANK9, BANK10, BANK11, BANK12, BANK13, BANK14 and BANK15. The DRAM operates in an x32 operation mode to read/write 32 bits of data in each column operation. In addition, the DRAM has a 4-bit prefetch architecture.

Referring to FIG. 6, the 1 GB DRAM is divided into four quarters QA, QB, QC and QD. The four 256 MB quarters QA, QB, QC and QD read or write data through corresponding pads DQ<0:31>. That is, the quarter QA reads or writes data through the pads DQ<0:7>, the quarter QB reads or writes data through the pads DQ<8:15>, the quarter QC reads or writes data through the pads DQ<16:23>, and the quarter QD reads or writes data through the pads DQ<24:31>.

The structure and operation of the DRAM will be described in more detail with reference to FIG. 6. In the following description, the prefetch operation will be omitted, and the DRAM will be described centering on the quarter QA.

Sixteen banks BANK0, BANK1, BANK2, BANK3, BANK4, BANK5, BANK6, BANK7, BANK8, BANK9, BANK10, BANK11, BANK12, BANK13, BANK14 and BANK15 are arranged symmetrically with respect to the center of a global core line controller 100. The sixteen banks are divided into the left banks BANK0, BANK2, BANK4, BANK6, BANK8, BANK10, BANK12 and BANK 14 (hereinafter, referred to LEFT_BANK) and the right banks BANK1, BANK3, BANK5, BANK7, BANK9, BANK11, BANK13 and BANK15 (hereinafter, referred to as RIGHT_BANK). The left banks LEFT_BANK and the global core line controller 100 are connected through left global core lines WGIO_CORE_LEFT_EV0<0:7> and RGIO_CORE_LEFT_EV0<0:7>, and the right banks RIGHT_BANK and the global core line controller 100 are connected through right global core lines WGIO_CORE_RIGHT_EV0<0:7> and RGIO_CORE_RIGHT_EV0<0:7>. The global core line controller 100 and the pads DQ<0:7> are connected through global I/O lines WGIO_IO_EV0<0:7> and RGIO_IO_EV0<0:7>.

This structure aims at separately controlling the left global core lines WGIO_CORE_LEFT_EV0<0:7> and RGIO_CORE_LEFT_EV0<0:7> and the right global core lines WGIO_CORE_RIGHT_EV0<0:7> and RGIO_CORE_RIGHT_EV<0:7> using the global core line controller 100 disposed in the center of the quarter QA.

The left global core lines WGIO_CORE_LEFT_EV0<0:7> and RGIO_CORE_LEFT_EV0<0:7> are divided into the left write global core lines WGIO_CORE_LEFT_EV0<0:7> for transferring data in the write operation, and the left read global core lines RGIO_CORE_LEFT_EV0<0:7> for transferring data in the read operation. The right global core lines WGIO_CORE_RIGHT_EV0<0:7> and RGIO_CORE_RIGHT_EV0<0:7> are divided into the right write global core lines WGIO_CORE_RIGHT_EV0<0:7> for transferring data in the write operation, and the left read global core lines RGIO_CORE_RIGHT_EV0<0:7> for transferring data in the read operation. In addition, the global I/O lines WGIO_IO_ RIGHT_EV0<0:7> and RGIO_IO_RIGHT_EV0<0:7> are divided into the write global I/O lines WGIO_IO_ RIGHT_EV0<0:7> for transferring data in the write operation, and the read global I/O lines RGIO_IO_ RIGHT_EV0<0:7> for transferring data in the read operation.

The global core line controller 110 disposed in the center of the quarter QA includes a bank enabling unit, an output strobe signal generating unit, a control signal generating unit, an input data transferring unit, and an output data transferring unit. The bank enabling unit enables a desired bank of the sixteen banks LEFT_BANK and RIGHT_BANK within the quarter QA.

Figure 7:
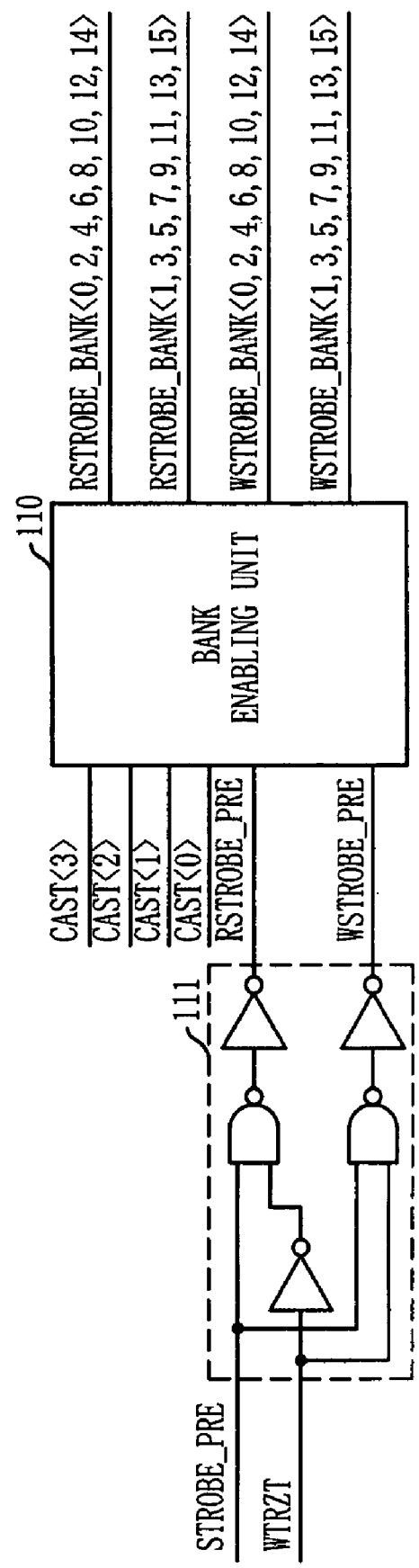
FIG. 7 is a circuit diagram illustrating a bank enabling unit of a global core line controller illustrated in FIG. 6.

FIG. 7 is a circuit diagram illustrating the bank enabling unit 110 of the global core line controller 100 illustrated in FIG. 6.

Referring to FIG. 7, the bank enabling unit 110 receives bank information CAST<0:3> on the sixteen banks LEFT_BANK and RIGHT_BANK, the write strobe signal WSTROBE_PRE, and the read strobe signal RSTROBE_PRE to output bank strobe signals RSTROBE_BANK<0, 2, 4, 6, 8, 10, 12, 14>, RSTROBE_BANK<1, 3, 5, 7, 9, 11, 13, 15>, WSTROBE_BANK<0, 2, 4, 6, 8, 10, 12, 14> and WSTROBE_BANK<1, 3, 5, 7, 9, 11, 13, 15> for enabling a desired bank.

"RSTROBE<0, 2, 4, 6, 8, 10, 12, 14>" is a strobe signal for enabling one of the left banks in the read operation, "RSTROBE<1, 3, 5, 7, 9, 11, 13, 15> is a strobe signal for enabling one of the right banks in the read operation, "WSTROBE_BANK<0, 2, 4, 6, 8, 10, 12, 14> is a strobe signal for enabling one of the left banks in the write operation, and "WSTROBE_BANK<1, 3, 5, 7, 9. 11, 13, 15> is a strobe signal for enabling one of the right banks in the write operation.

Meanwhile, a strobe signal activating unit 111 receives a column strobe signal STROBE_PRE and a read/write signal WTRZT to output the write strobe signal WSTROBE_PRE and the read strobe signal RSTROBE_PRE. The column strobe signal STROBE_PRE is activated during the column operation in the read/write operations. The write strobe signal WSTROBE_PRE and the read strobe signal RSTROBE_PRE are activated in the write operation and the read operation, respectively.

Figure 8:
FIG. 8 is a block diagram illustrating an output strobe signal generating unit of the global core line controller illustrated in FIG. 6.

FIG. 8 is a block diagram illustrating the output strobe signal generating unit 120 of the global core line controller 100 illustrated in FIG. 6.

Referring to FIG. 8, the output strobe signal generating unit 120 includes a third delay unit 121 which delays the read strobe signal RSTROBE_PRE by a predetermined time to output an output strobe signal RSTROBE_IO. In the read operation, the 8-bit data of the bank are transferred to the read global I/O lines RGIO_IO_EV0<0:7> in response to the output strobe signal RSTROBE_IO. This operation will be described later in more detail with reference to FIGS. 11 and 13.

Figure 9:
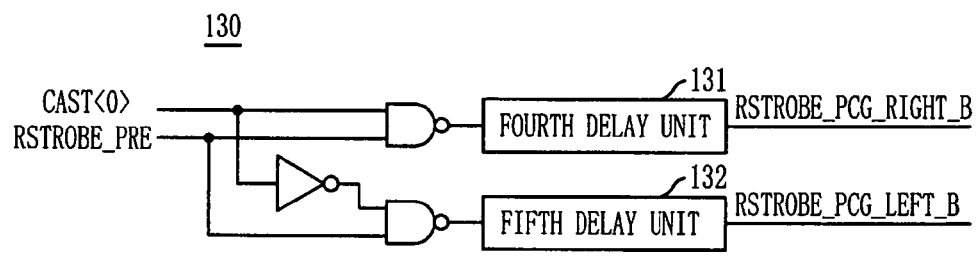
FIG. 9 is a circuit diagram illustrating a control signal generating unit of the global core line controller illustrated in FIG. 6.

FIG. 9 is a circuit diagram illustrating the control signal generating unit 130 of the global core line controller 100 illustrated in FIG. 6.

Referring to FIG. 9, the control signal generating unit 130 generates control signals RSTROBE_PCG_RIGHT_B and RSTROBE_PCT_LEFT_B for precharging one of the right read global core lines RGIO_CORE_RIGHT_EV0<0:7> and one of the left read global core lines RGIO_CORE_LEFT_EV0<0:7> according to one of the bank information CAST<0:3>, e.g., the bank information CAST<0> that can discern the left banks and the right banks.

The control signal RSTROBE_PCG_RIGHT_B is activated to a logic low level to precharge the left read global core lines RGIO_CORE_LEFT_EV0<0:7> to a logic low level, and the control signal RSTROBE_PCG_LEFT_B is activated to a logic low level to precharge the right read global core lines RGIO_CORE_RIGHT_EV0<0:7> to a logic low level.

Fourth and fifth delay units 131 and 132 and the third delay unit 120 of FIG. 8 provide a more stable timing matching in the read operation. For example, when the read operation is performed on one of the left banks LEFT_BANK, the control signal RSTROBE_PCG_LEFT_B for precharging the right read global core lines RGIO_CORE_RIGHT_EV0<0:7> is activated earlier than the bank strobe signal selected from the bank strobe signals RSTROBE_BANK<0, 2, 4, 6, 8, 10, 12, 14> for enabling one of the left banks LEFT_BANK, and the output strobe signal RSTROBE_IO is activated later than the selected bank strobe signal.

Figure 10:
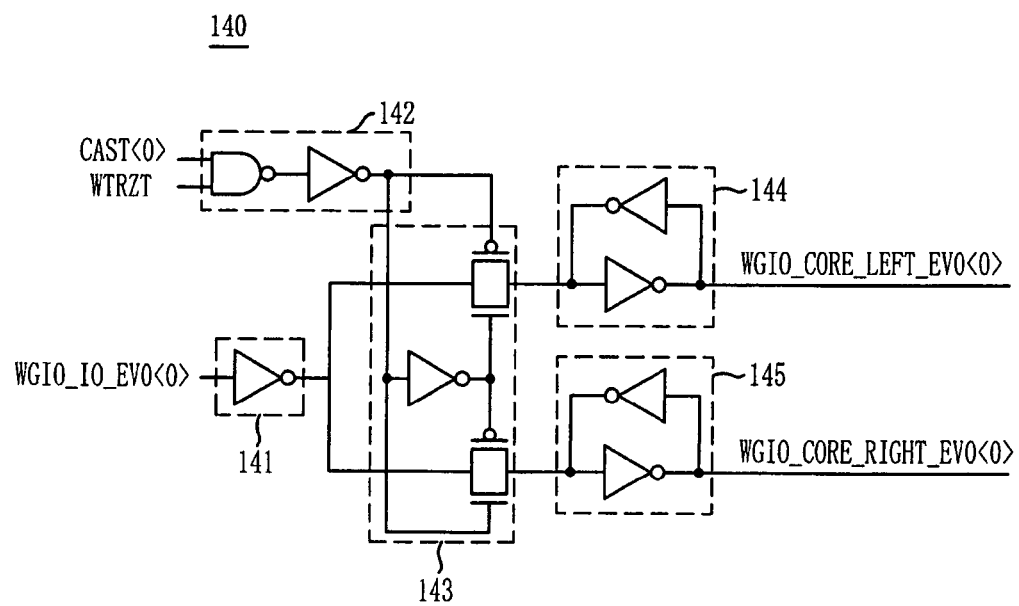
FIG. 10 is a circuit diagram illustrating an input data transferring unit of the global core line controller illustrated in FIG. 6.

FIG. 10 is a circuit diagram illustrating the input data transferring unit 140 of the global core line controller 100 illustrated in FIG. 6.

For convenience, the input data transferring unit 140 will be described for the most part about the "WGIO_IO_EV0<0> line of the write global I/O lines WGIO_IO_EV0<0:7>, the "WGIO_CORE_LEFT_EV0<0>" line of the left write global core lines WGIO_CORE_LEFT_EV0<0:7>, and the "WGIO_CORE_RIGHT_EV0<0>" line of the right write global core lines WGIO_CORE_RIGHT_EV0<0:7>.

Referring to FIG. 10, the input data transferring unit 140 includes a data input unit 141, a control unit 142, and a transfer unit 143. The data input unit 141 receives data through the write global I/O line WGIO_IO_EV0<0>, and the control unit 142 receives the read/write signal WTRZT and the bank information CAST<0>. The transfer unit 143 transfers an output signal of the data input unit 141 to the left write global core line WGIO_CORE_LEFT_EV0<0> or the right write global core line WGIO_CORE_RIGHT_EV0<0> in response to an output signal of the control unit 142. In addition, the input data transferring unit 140 further includes a first latch unit 144 and a second latch unit 145. The first latch unit 144 latches data inputted through the left write global core line WGIO_CORE_LEFT_EV0<0>, and the second latch unit 145 latches data inputted through the right write global core line WGIO_CORE_RIGHT_EV0<0>.

Figure 11:
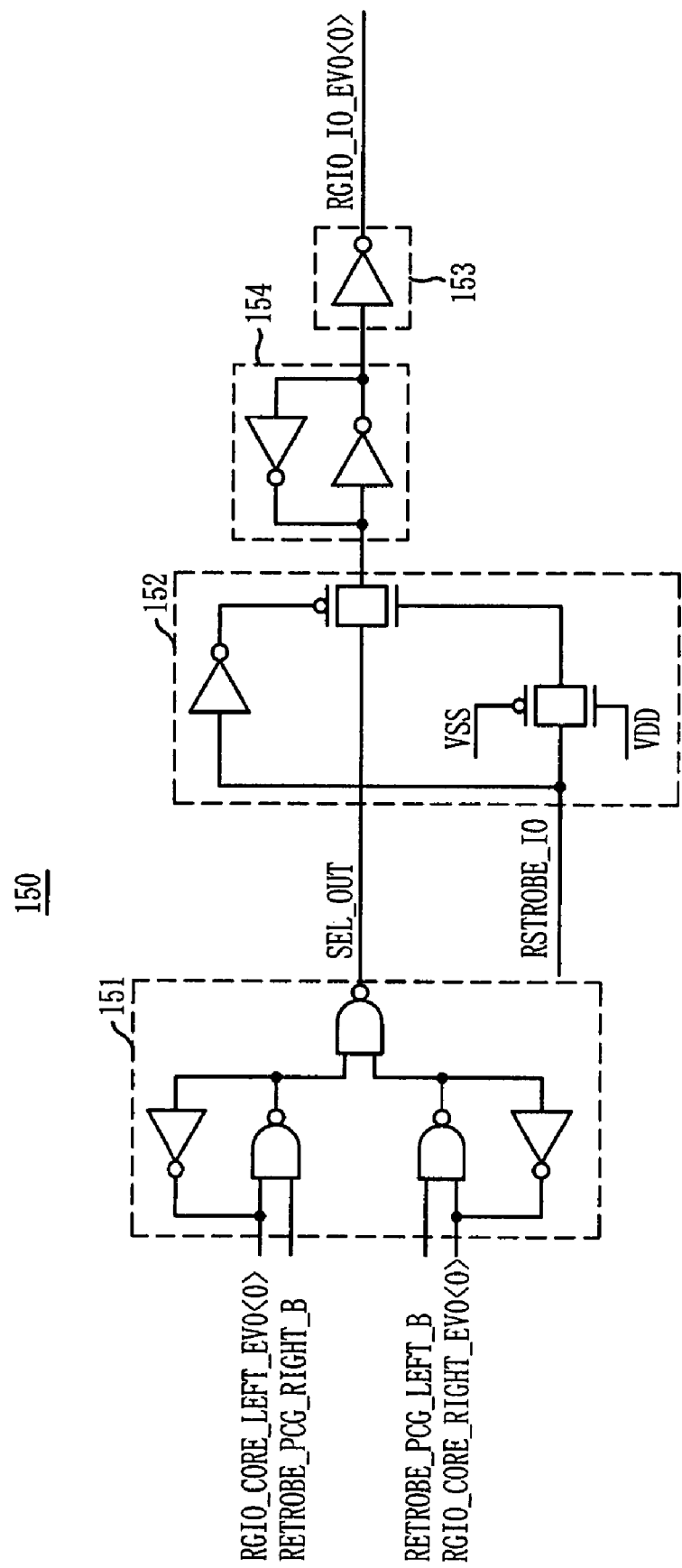
FIG. 11 is a circuit diagram illustrating an output data transferring unit of the global core line controller illustrated in FIG. 6.

FIG. 11 is a circuit diagram illustrating the output data transferring unit 150 of the global core line controller 100 illustrated in FIG. 6.

For convenience, the output data transferring unit 150 will be described, for the most part about the "RGIO_IO_EV0<0:7>" line of the read global I/O lines RGIO_IO_EV0<0:7>, the "RGIO_CORE_LEFT_EV0<0>" line of the left read global core lines RGIO_CORE_LEFT_EV0<0:7>, and the "RGIO_CORE_RIGHT_EV0<0>" line of the right read global core lines RGIO_CORE_RIGHT_EV<0:7>.

Referring to FIG. 11, the output data transferring unit 150 includes a selection unit 151, a transfer unit 152, a latch unit 154, and an output unit 153. The selection unit 151 selectively outputs one of the left read global core line RGIO_CORE_LEFT_EV0<0> and the right read global core line RGIO_CORE_RIGHT_EV0<0> in response to the control signals RSTROBE_PCG_LEFT_B and RSTROBE_PCG_RIGHT_B. The transfer unit 152 transfers an output signal SEL_OUT of the selection unit 151 to the latch unit 154 in response to the output strobe signal RSTROBE_IO. The latch unit 154 latches an output signal of the transfer unit 152. The output unit 153 outputs the latched data through the read global I/O line RGIO_IO_EV0<0>.

Figure 12:
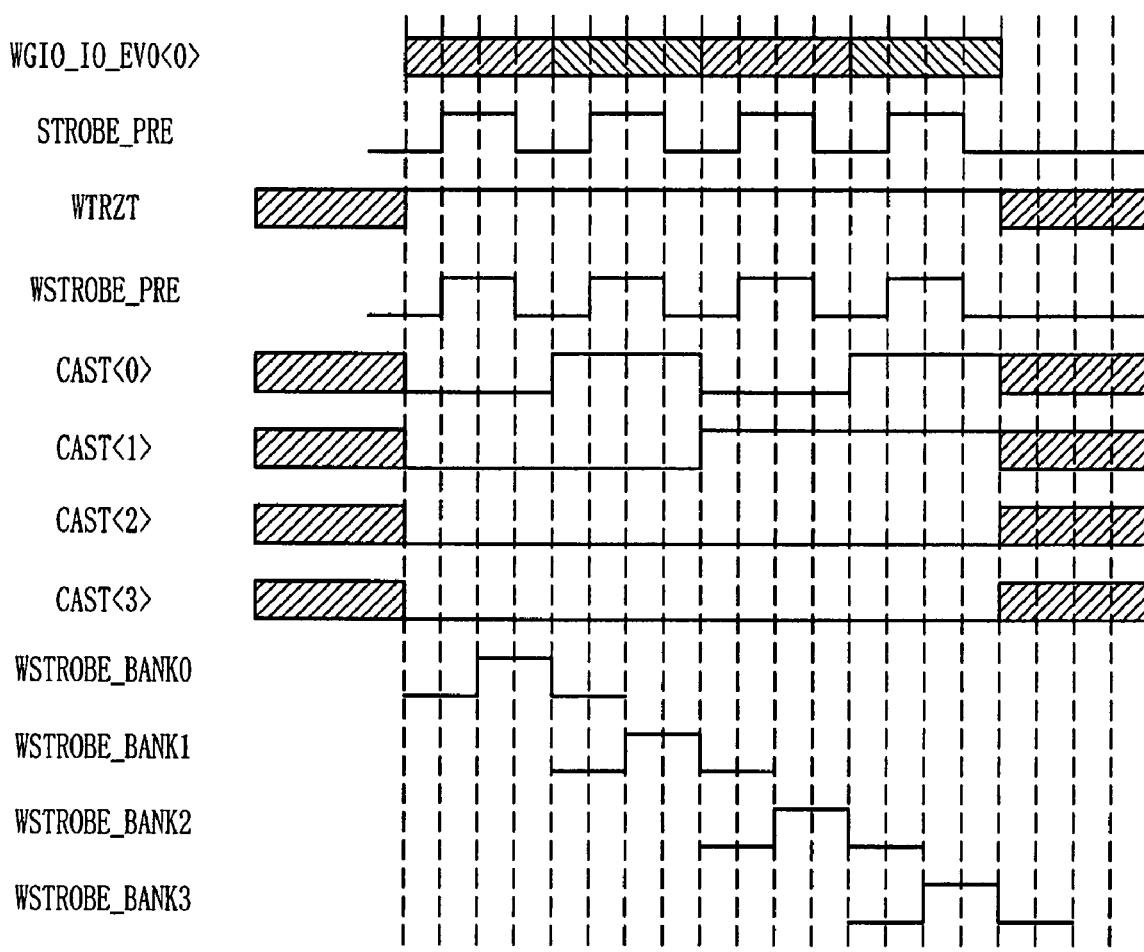
FIG. 12 is a timing diagram of the write operation in accordance with an embodiment of the present invention.

FIG. 12 is a timing diagram of the write operation in accordance with an embodiment of the present invention.

Referring to FIG. 12, the write strobe signal WSTROBE_PRE is generated in response to the column strobe signal STROBE_PRE and the read/write signal WTRZT. In this case, the read/write signal WTRZT is a logic high level. When the write strobe signal WSTROBE_PRE is activated, the bank strobe signal of the corresponding bank is generated based on the bank information CAST<0:3>. That is, one of the bank strobe signals WSTROBE_BANK<0:15> is generated. In FIG. 12, the bank strobe signals WSTROBE_BANK<4:15> are not shown. Therefore, the data inputted through the write global I/O line WGIO_IO_EV0<0> is transferred and written to the selected bank.

Referring again to FIG. 10, the input data transferring unit 140 transfers the data inputted through the write global I/O line WGIO_IO_EV0<0> to the left write global core line WGIO_CORE_LEFT_EV0<0> or the right write global core line WGIO_CORE_RIGHT_EV0<0> according to the bank information, e.g., CAST<0>.

Figure 13:
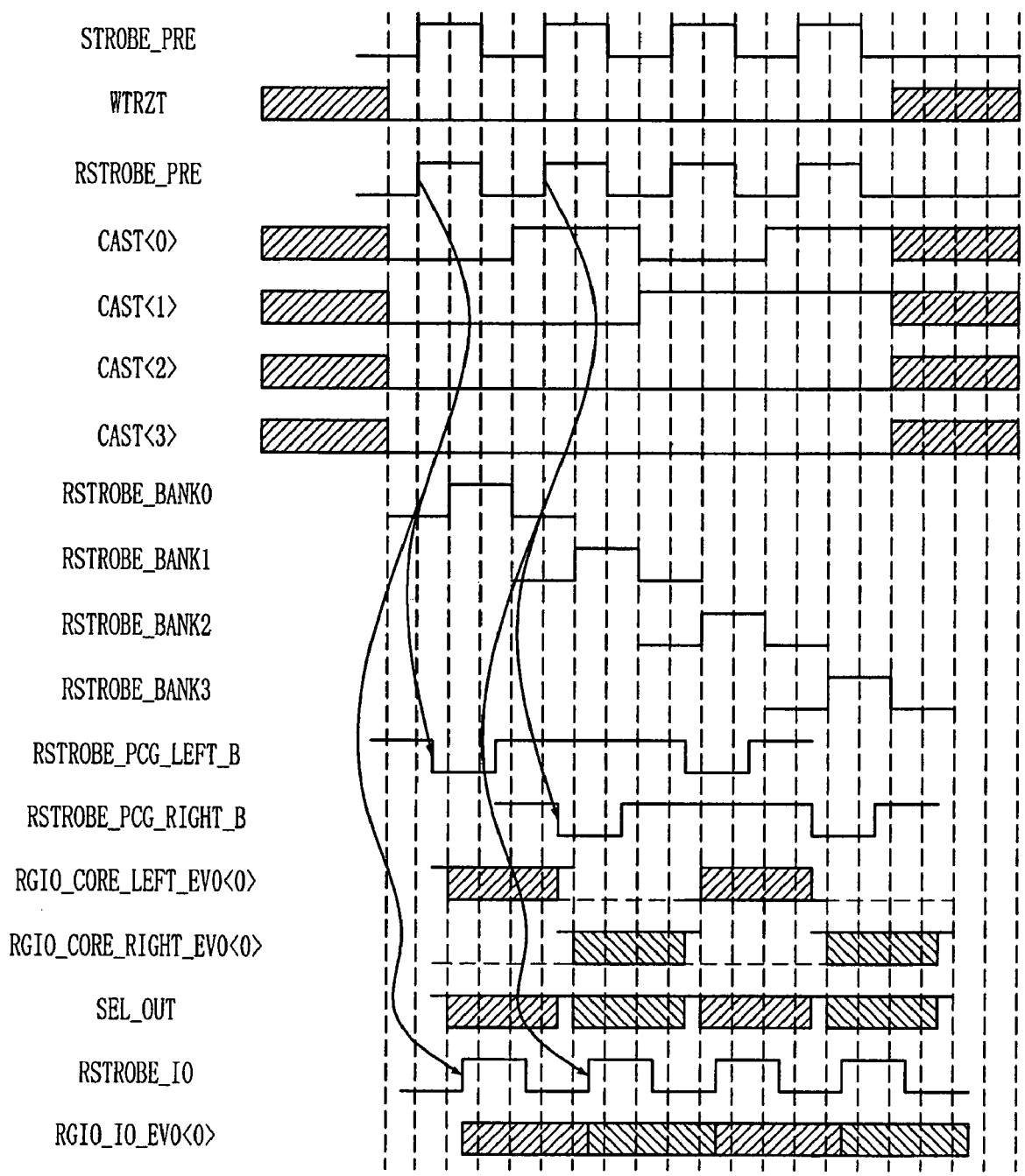
FIG. 13 is a timing diagram of the read operation in accordance with an embodiment of the present invention.

FIG. 13 is a timing diagram of the read operation in accordance with an embodiment of the present invention.

Figure 1:
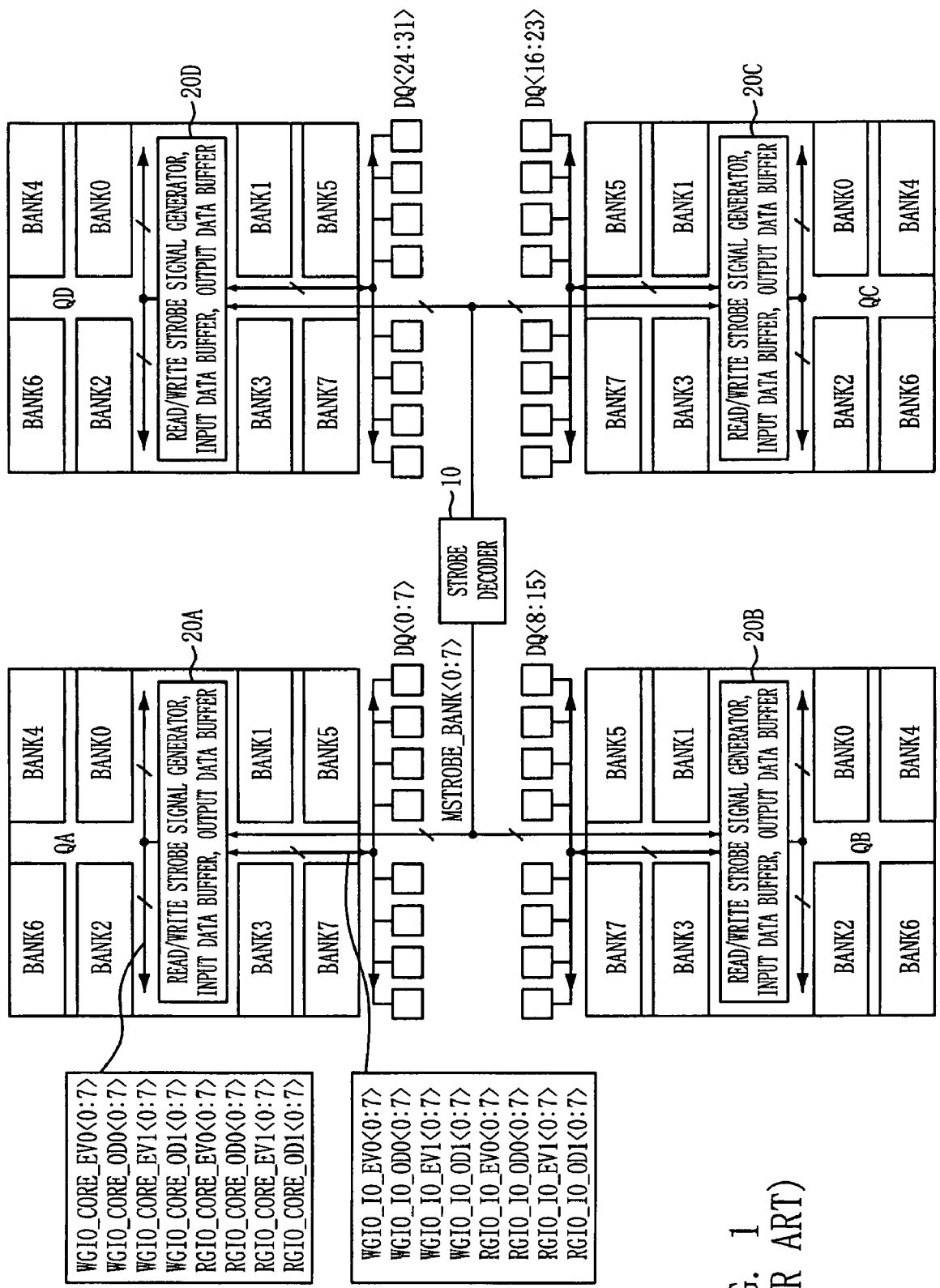
FIG. 1 is a layout diagram of a conventional dynamic random access memory (DRAM)
Figure 2:
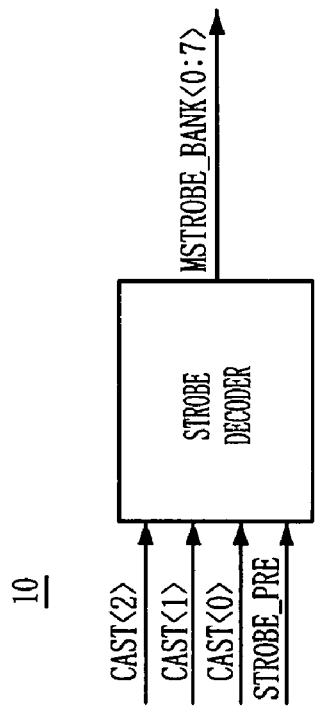
FIG. 2 is a block diagram of a strobe decoder illustrated in FIG. 1.
Figure 3:
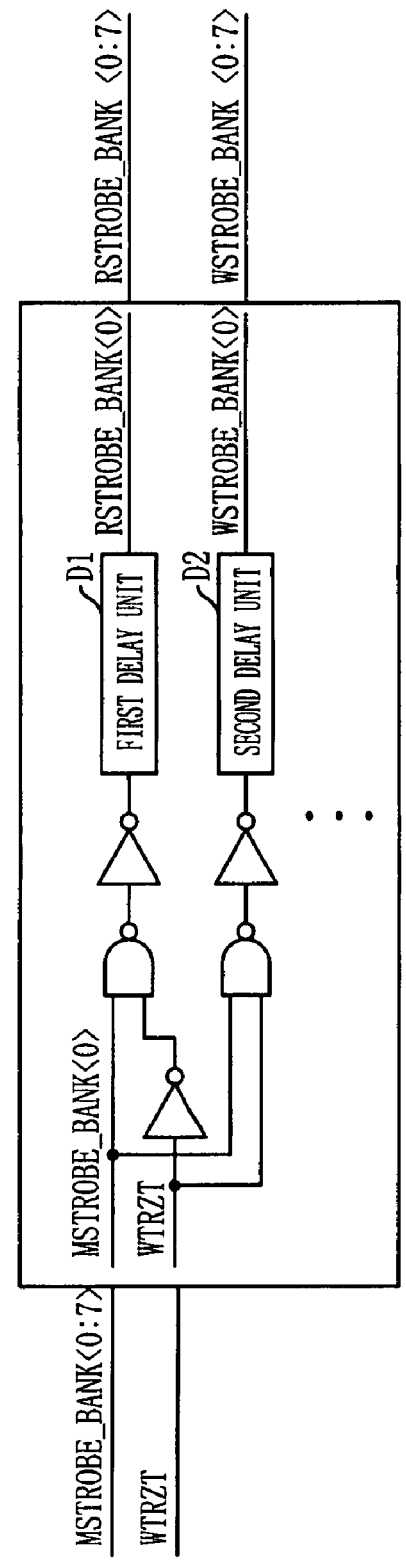
FIG. 3 is a circuit diagram of a read/write strobe signal generator illustrated in FIG. 1.
Figure 4:
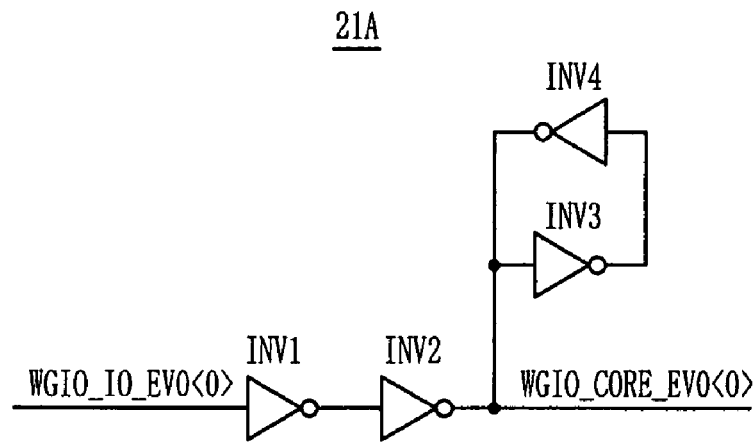
FIG. 4 is a circuit diagram of an input data buffer illustrated in FIG. 1.
Figure 5:
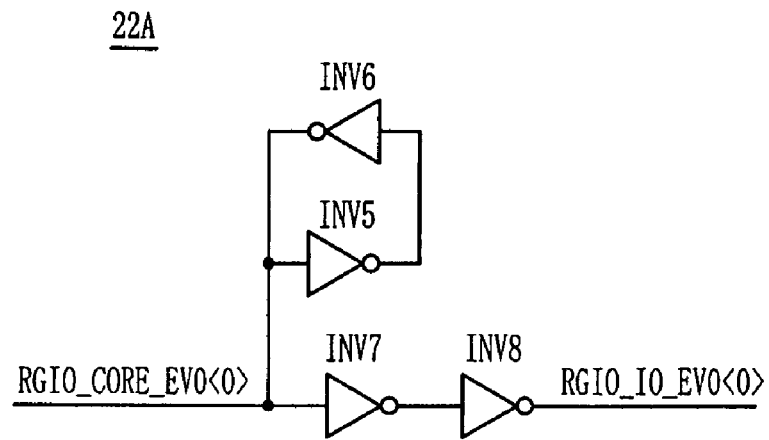
FIG. 5 is a circuit diagram of an output data buffer illustrated in FIG. 1.

Referring to FIG. 13, the read strobe signal RSTROBE_PRE is generated in response to the column strobe signal STROBE_PRE and the read/write signal WTRZT. In this case, the read/write signal WTRZT is a logic low level. The control signals RSTROBE_PCG_LEFT_B and RSTROBE_PCG_RIGHT_B change to a logic high level. The control signals RSTROBE_PCG_LEFT_B and RSTROBE_PCG_RIGHT_B are signals for precharging the left read global core line RGIO_CORE_LEFT_EV0<0> or the read right write global core line RGIO_CORE_RIGHT_EV0<0> connected to the banks other than the banks to be selected by the bank information CAST<0:3>. Therefore, the corresponding lines are precharged to a logic low level. Then, when one of the bank strobe signals RSTROBE_BANK<0:15> is activated to a logic high level, data are transferred to the left read global core line RGIO_CORE_LEFT_EV0<0> or the right read global core line RGIO_CORE_RIGHT_EV0<0> connected to the enabled bank. In FIG. 1, the bank strobe signals RSTROBE_BANK<4:15> are not shown.

The selection unit 151 of FIG. 11 selectively outputs the transferred data in response to the control signals RSTROBE_PCG_LEFT_B and RSTROBE_PCG_RIGHT_B, and the output signal SEL_OUT of the selection unit 151 is outputted through the read global I/O line RGIO_IO_EV0<0> in response to the output strobe signal RSTROBE_IO. Meanwhile, the control signals RSTROBE_PCG_LEFT_B and RSTROBE_PCG_RIGHT_B serve as control signals for precharging the left read global core line RGIO_CORE_LEFT_EV0<0> or the right read global core line RGIO_CORE_RIGHT_EV0<0>, and also serve as select signals for selecting one of the left read global core line RGIO_CORE_LEFT_EV0<0> or the right read global core line RGIO_CORE_RIGHT_EV0<0>.

As described above, the banks of the quarter QA are divided into the left banks and the right banks and the read/write operations are separately performed on the left banks and the right banks. Therefore, compared with the case where the 1 G 16-bank memory device is constructed using the conventional structure, the loading and junction of the respective global lines are reduced by ½.

In addition, shielding lines constructed according to the respective global lines can be reduced because the global lines to transfer the bank strobe signals from the peripheral region to the bank region is unnecessary.

Although the problems caused by the increase from eight banks to sixteen banks have been described, it is apparent to those skilled in the art that the problems are caused by the increase in the number of the multi-bank.

As described above, the bank region is divided into more than two regions and the global lines are connected to the corresponding banks. Hence, it is possible to minimize the timing delay and the slope of the voltage level in the data transferred through the global lines connected to the enabled banks. Further, the entire usage rate of the global lines can be increased by precharging the global lines connected to other banks.

Moreover, the global lines that have transferred the bank strobe signals in the related art and the shielding lines can be reduced by generating the bank strobe signals in the bank region, thereby reducing the layout of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a global input/output line;
   a first global core line;
   a second global core line;
   a global core line controller disposed between the first global core line and the second global core line;
   a first bank coupled to the global core line controller through the first global core line; and
   a second bank coupled to the global core line controller through the second global core line,
   wherein the global core line controller includes
   a read/write strobe signal activating unit configured to receive read/write information and a strobe signal for a column operation to output a read strobe signal and a write strobe signal, the read strobe signal and the write strobe signal being activated in a read operation and a write operation, respectively.

2. The semiconductor memory device as recited in claim 1, wherein the global core line controller separately controls the first global core line and the second global core line.

3. The semiconductor memory device as recited in claim 1, wherein the first global core line comprises a first read global core line and a first write global core line, and the second global core line comprises a second read global core line and a second write global core line.

4. The semiconductor memory device as recited in claim 3, wherein data is transferred through one of the first and second read global core lines in a read operation, and the other of the first and second read global core lines is precharged.

5. The semiconductor memory device as recited in claim 3, wherein the global core line controller comprises a bank enabling unit configured to enable one of the first and second banks in response to first bank information, second bank information, the read strobe signal, and the write strobe signal.

6. The semiconductor memory device as recited in claim 1, wherein the global core line controller further comprises a control signal generating unit configured to generate a control signal for precharging one of the first and second read global core lines in response to the read strobe signal and the first and second bank information, the one of the first and second read global core lines being a read global core line connected to the banks other than the enabled bank.

7. The semiconductor memory device as recited in claim 6, wherein the control signal is activated before the bank is enabled.

8. The semiconductor memory device as recited in claim 6, wherein the global input/output line comprises a read global input/output line and a write global input/output line.

9. The semiconductor memory device as recited in claim 8, wherein the global core line controller further comprises an output strobe signal generating unit configured to receive the read strobe signal to generate an output strobe signal for transferring data of the read global core line to the read global input/output line.

10. The semiconductor memory device as recited in claim 9, wherein the output strobe signal is activated after the bank is enabled.

11. The semiconductor memory device as recited in claim 9, wherein the control signal comprises a first control signal for precharging the first read global core line, and a second control signal for precharging the second read global core line.

12. The semiconductor memory device as recited in claim 11, wherein the global core line controller further includes an input data transferring unit configured to transfer data inputted through the write global input/output line to one of the first and second write global core lines in response to the first and second bank information.

13. The semiconductor memory device as recited in claim 12, wherein the input data transferring unit comprises:
   a control unit configured to receive the read/write information and at least one of the first and second bank information;
   an input unit configured to receive data through the write global core input/output line; and
   a transfer unit configured to selectively transfer an output signal of the input unit to one of the first and second write global core lines in response to an output signal of the control unit.

14. The semiconductor memory device as recited in claim 13, wherein the input data transferring unit further comprises a latch unit configured to latch an output signal of the transfer unit.

15. The semiconductor memory device as recited in claim 11, wherein the global core line controller further comprises an output data transferring unit configured to transfer data of one of the first and second global core lines to the read global input/output line in response to the first and second control signals.

16. The semiconductor memory device as recited in claim 15, wherein the output data transferring unit comprises:
   a selection unit configured to selectively output the data of the first and second read global core lines in response to the first and second control signals;
   a transfer unit configured to transfer an output signal of the selection unit in response to the output strobe signal; and
   an output unit configured to transfer an output signal of the transfer unit to the read global input/output line.

17. The semiconductor memory device as recited in claim 16, wherein the output data transferring unit further comprises a latch unit configured to latch an output signal of the transfer unit.

* * * * *